United States Patent
Wang

(10) Patent No.: US 6,497,982 B1
(45) Date of Patent: Dec. 24, 2002

(54) METHOD FOR SUPPRESSING OPTICAL PROXIMITY EFFECT BIAS WITHIN A WAFER

(75) Inventor: Li-Ming Wang, Taoyuan (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/598,828

(22) Filed: Jun. 21, 2000

(30) Foreign Application Priority Data

Feb. 15, 2000 (TW) ........................................ 89102551 A

(51) Int. Cl.7 .............................. G03F 9/00; G03C 5/00
(52) U.S. Cl. .......................... 430/30; 430/296; 430/942
(58) Field of Search ........................... 430/30, 296, 942

(56) References Cited

U.S. PATENT DOCUMENTS 6,087,052 A * 7/2000 Manabe et al. ............... 430/30
6,284,419 B2 * 9/2001 Pierrat et al. .................. 430/30

* cited by examiner

Primary Examiner—Christopher G. Young
(74) Attorney, Agent, or Firm—Niro, Scavone, Halter & Niro

(57) ABSTRACT

A method for suppressing the optical proximity effect bias within a wafer by compensating the optical proximity effect within the wafer includes the steps of: Firstly, performing a first exposure step with a first exposure parameter setup to transfer a pattern from a photomask to a first die of the wafer. Secondly, performing a second exposure step with a second exposure parameter setup to transfer the pattern from the photomask to a second die of the wafer, wherein the first and second exposure parameter setups are adjusted according to the local optical proximity effect bias of the dies within the wafer. The exposure parameter setup can be numerical aperture setup, partial coherence setup, exposure energy setup, exposure time setup, exposure light intensity setup, or best focus setup. The light source used in the exposure steps can be an I-line, G-line, KrF laser, ArF laser, X-ray, or e-beam.

20 Claims, 3 Drawing Sheets

Fig. 1

METHOD FOR SUPPRESSING OPTICAL PROXIMITY EFFECT BIAS WITHIN A WAFER

FIELD OF THE INVENTION

The present invention is generally related to a method for suppressing the optical proximity effect (OPE) bias within a wafer, and more particularly to a method for compensating the optical proximity effect bias within a wafer such that the OPE result is fixed from die to die within the wafer.

BACKGROUND OF THE INVENTION

With respect to the semiconductor fabrication processes, the lithography process occupies a decisive factor in the performance of the manufactured semiconductor device. The result of the lithography process may seriously affect the integration level of the manufactured semiconductor device. The lithography process is to utilize the exposure principle of optics to transfer the pattern from the photomask onto the surface of semiconductor wafer, and then an etch process is performed according to the transferred pattern so as to manufacture the desired semiconductor device.

Nonetheless, the occurrence of the well-known optical proximity effect (OPE) is an inevitable concern during semiconductor fabrication process. OPE is resulted from the absence of higher-order diffraction order during the image formation process, and it will negatively affect the accuracy and resolution of the transferred pattern. Consequently, OPE will result in a severe change of critical dimension and make the profile of the semiconductor structure formed thereby out of shape. Moreover, because the properties, such as thickness, type, reflectivity of the substrate film and/or the type, thickness of the selected photoresist material, are not uniform, it will cause the OPE result to be different from die to die within a wafer and thus the performance is different from chip to chip.

In convention, the exposure process is carried out in an exposure equipment, such as a stepper. The exposure process is carried out in a manner known as "step and repeat". The exposure parameters and exposure condition setup in every exposure step, however, is fixed. Please refer to FIG. 1 showing the reflectivity of the silicon nitride film across a wafer. It will be understood that the reflectivity is increased gradually from the center region of the wafer to the edge region of the wafer. If the properties, i.e. thickness, reflectivity etc., are not uniform, the OPE result will differ from die to die within the wafer and the quality of manufactured semiconductor device will be affected.

There arose a need to suppress the optical proximity effect bias within a wafer by compensating the optical proximity effect bias from die to die within the wafer.

SUMMARY OF THE INVENTION

It is therefore an object of the present invention to provide a method for suppressing the optical proximity effect bias within a wafer by compensating the optical proximity effect bias from die to die within the wafer.

It is further an object of the present invention to provide a method for producing chips with the same quality and performance control.

According to the present invention, the method for suppressing the optical proximity effect within a wafer includes the following steps: Firstly, performing a first exposure step with a first exposure parameter setup to transfer a pattern from a photomask to a first die of a wafer. Secondly, performing a second exposure step with a second exposure parameter to transfer the pattern from the photomask to a second die of the wafer, wherein the first and second exposure parameter setups are adjusted according to the local optical proximity effect bias of the dies within the wafer.

In accordance with the present invention, the wafer is further coated with a silicon nitride substrate film.

In accordance with the present invention, the exposure parameter setup is a numerical aperture setup.

In accordance with the present invention, the exposure parameter setup is a partial coherence setup.

In accordance with the present invention, the exposure parameter setup is an exposure energy setup.

In accordance with the present invention, the exposure parameter setup is an exposure time setup.

In accordance with the present invention, the exposure parameter setup is an exposure light intensity setup.

In accordance with the present invention, the exposure parameter setup is a focus setup, more preferably, a best focus setup.

In accordance with the present invention, the light source used in the exposure steps is an I-line.

In accordance with the present invention, the light source used in the exposure steps is a G-line.

In accordance with the present invention, the light source used in the exposure steps is an KrF laser.

In accordance with the present invention, the light source used in the exposure steps is an ArF laser.

In accordance with the present invention, the light source used in the exposure steps is a X-ray.

In accordance with the present invention, the light source used in the exposure steps is an e-beam.

In accordance with the present invention, the exposure steps are performed by an exposure equipment, such as a stepper or a scanner.

Now the present invention may best be understood through the following descriptions with reference to the accompanying drawings, in which:

BRIEF DESCRIPTION OF THE DRAWINGS

FIG. 1 shows the reflectivity of the silicon nitride film across wafer;

DETAILED DESCRIPTION OF THE PREFERRED EMBODIMENTS

The method for suppressing the optical proximity effect bias within a wafer according to the present invention is based on the recognition that if the exposure parameter setup in every exposure step is not fixed but can be adjusted according to the local OPE bias of the dies on the wafer, a fixed OPE can be obtained from die to die within the wafer. Thus, the chips produced thereby will have the same quality and performance control.

Figure 1:
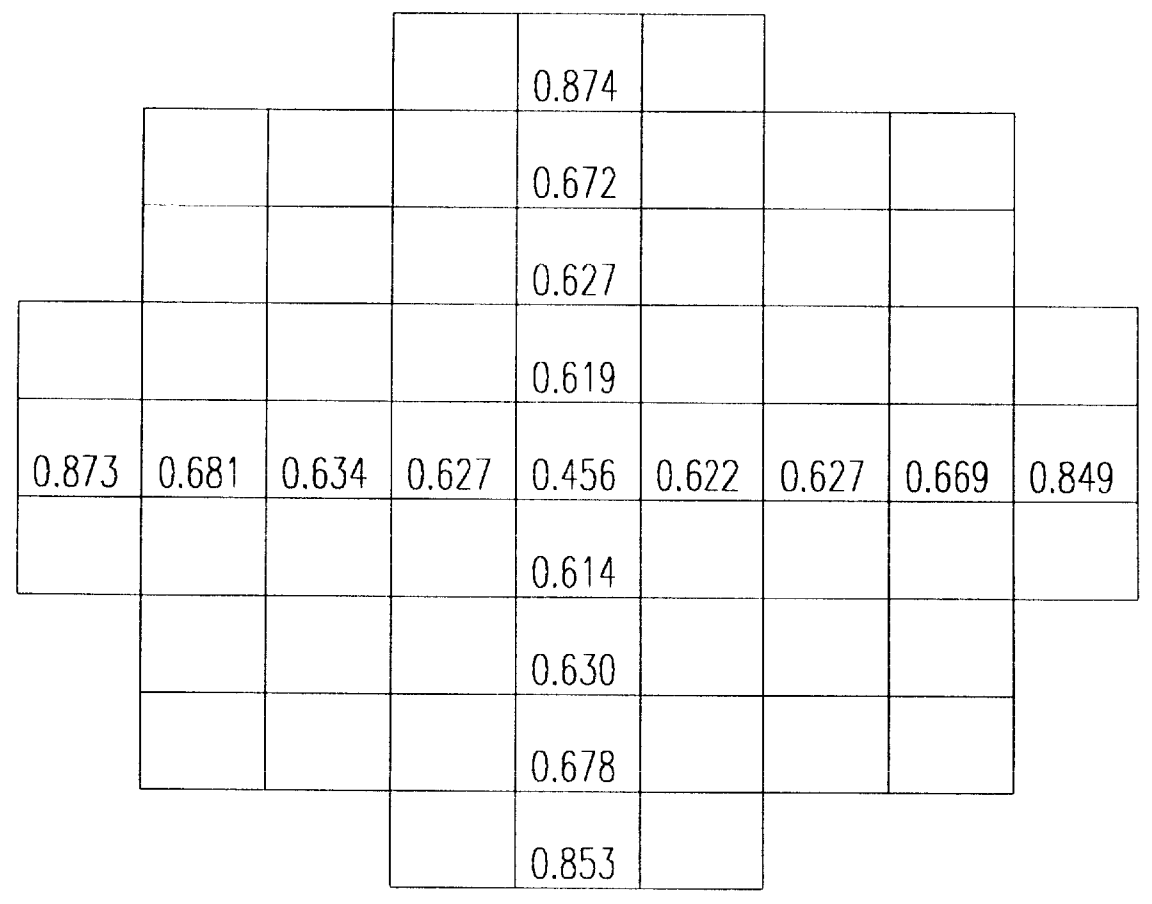
Figure 2:
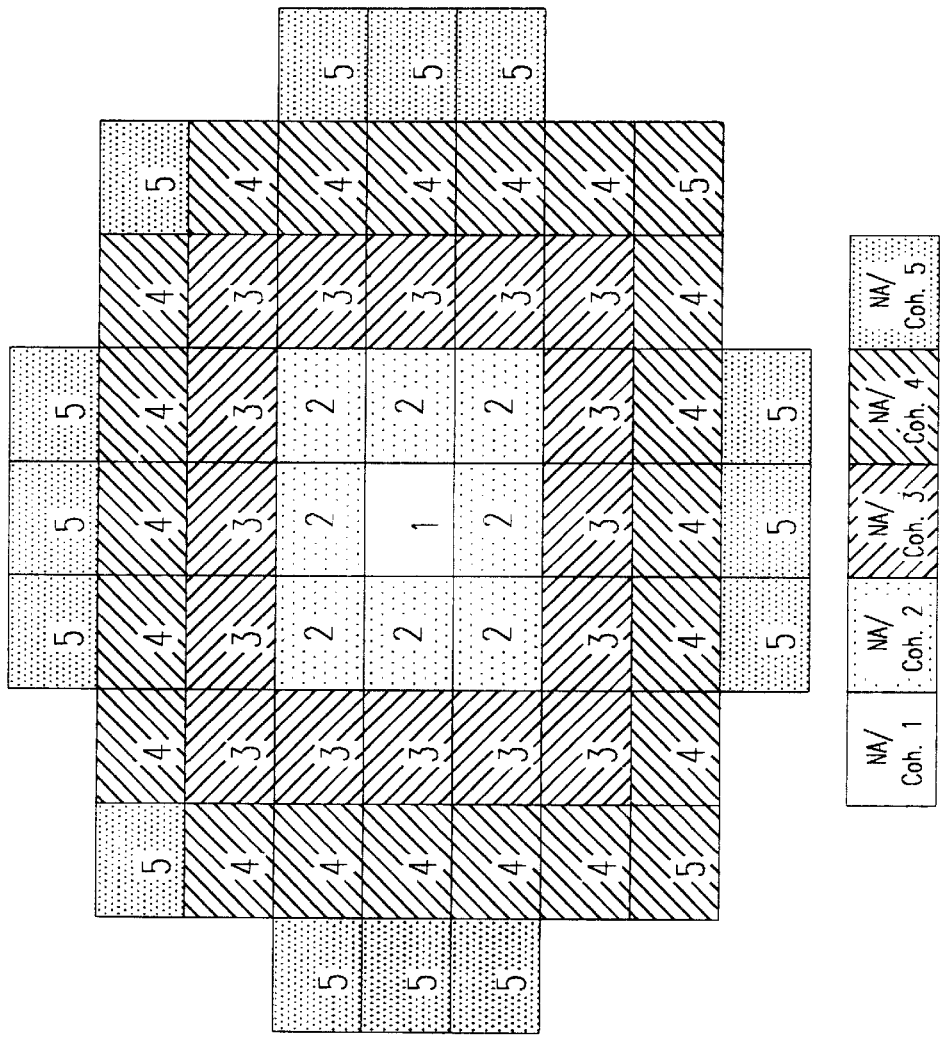
FIG. 2 is a schematic diagram illustrating the five-gradation adaptive exposure parameter distribution within a wafer according to the present invention.

Please refer to FIG. 2 which illustrates the five-gradation adaptive exposure parameter distribution within a wafer according to the present invention. The major characteristic of the present invention is that unlike the conventional exposure process, the exposure parameters, such as numerical aperture, partial coherence, etc., is adaptive for every exposure step. Five exposure parameter gradations shown in FIG. 2 are respectively corresponding to the non-uniform properties of the substrate film or the photoresist shown in FIG. 1. While performing the exposure process, the exposure parameters from shot to shot can be adaptively setup depending on the local OPE bias of the die within the wafer so as to compensate the OPE bias from die to die within the wafer.

Figure 3:
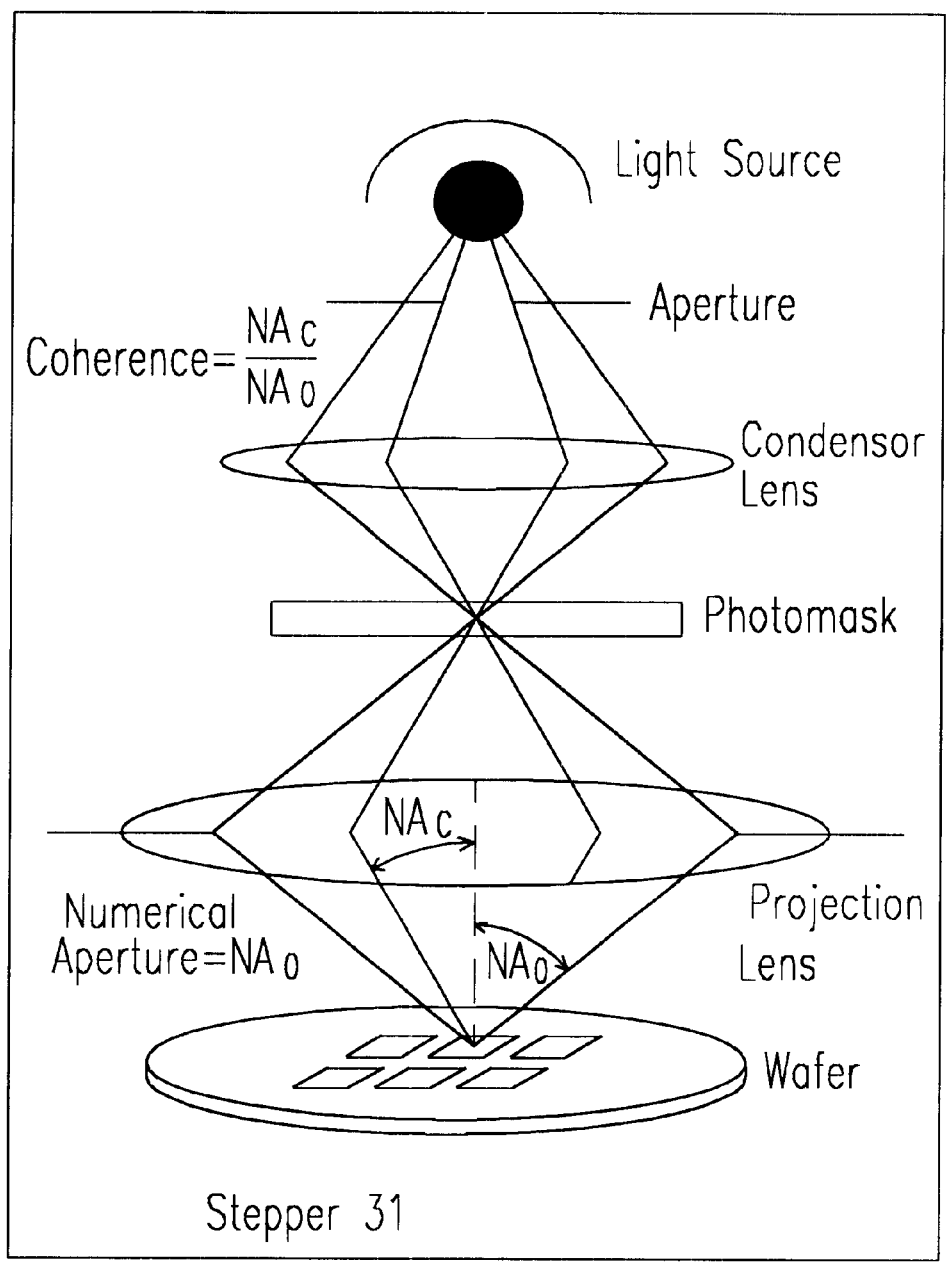
FIG. 3 is a schematic diagram showing the configuration in a stepper or scanner.

Please refer to FIG. 3 which shows the configuration in a stepper or scanner 31. The aforesaid adaptive exposure parameters or exposure condition can be setup in an exposure equipment, such as a stepper or scanner 31. While the exposure steps are performing, the operator can setup the exposure parameters according to the exposure parameter gradation where the die locates. The optical proximity effect bias within the wafer can be suppressed properly without employing a complicated and costly correction method to correct the optical proximity effect bias within a wafer.

Furthermore, the exposure parameter could be, but not limited to, numerical aperture, partial coherence, exposure energy, exposure time interval, exposure light intensity, or best focus. The light source used in the exposure equipment could be an I-line, G-line, KrF laser, ArF laser, X-ray, or e-beam.

Although the present invention has been described and illustrated in detail, it is to be clearly understood that the same is by the way of illustration and example only and is riot to be taken by way of limitation, the spirit and scope of the present invention being limited only by the terms of the appended claims.

I claim:

1. A method for suppressing optical proximity effect bias within a wafer by compensating the optical proximity effect bias from die to die within said wafer, comprising the steps of:
    performing a first exposure step with a first exposure parameter setup to transfer a pattern from a photomask onto a first die of said wafer; and
    performing a second exposure step with a second exposure parameter setup to transfer a pattern from a photomask onto a second die of said wafer, wherein said first and second exposure parameter setups are adjusted according to the local optical proximity effect bias of said dies within said wafer so that a fixed optical proximity effect can be obtained from die to die within said wafer.

2. A method as defined in claim 1 wherein said wafer is further coated with a silicon nitride substrate film.

3. A method as defined in claim 1 wherein said exposure parameter setup is a numerical aperture setup.

4. A method as defined in claim 1 wherein said exposure parameter setup is a partial coherence setup.

5. A method as defined in claim 1 wherein said exposure parameter setup is an exposure energy setup.

6. A method as defined in claim 1 wherein said exposure parameter setup is an exposure time setup.

7. A method as defined in claim 1 wherein said exposure parameter setup is an exposure light intensity setup.

8. A method as defined in claim 1 wherein said exposure parameter setup is a focus setup.

9. A method as defined in claim 8 wherein said focus setup is a best focus setup.

10. A method as defined in claim 1 wherein the light source used in said exposure steps is one selected from a group consisting of an I-line, a G-line, a KrF laser, an ArF laser, an x-ray, and an electron-beam.

11. A method as defined in claim 1 wherein said exposure steps are performed by an exposure equipment.

12. A method as defined in claim 11 wherein said exposure equipment is a stepper.

13. A method as defined in claim 11 wherein said exposure equipment is a scanner.

14. A method for suppressing optical proximity effect bias within a wafer, comprising the steps of:
    evaluating the optical proximity effect of a first die of said wafer;
    performing a first exposure step to transfer a pattern from a photomask onto said first die of said wafer;
    determining the local optical proximity effect bias of a second die of said wafer from that of said first die of said wafer; and
    performing a second exposure step to transfer said pattern from said photomask to said second die of said wafer, in which an exposure parameter setup of said second exposure step is derived form adjusting said exposure parameter setup of said first exposure step according to said local optical proximity effect bias.

15. A method as defined in claim 14 wherein said exposure parameter setup is a numerical aperture setup.

16. A method as defined in claim 14 wherein said exposure parameter setup is a partial coherence setup.

17. A method as defined in claim 14 wherein said exposure parameter setup is an exposure energy setup.

18. A method as defined in claim 14 wherein said exposure parameter setup is an exposure time setup.

19. A method as defined in claim 14 wherein said exposure parameter setup is an exposure light intensity setup.

20. A method as defined in claim 14 wherein said exposure parameter setup is a best focus setup.

* * * * *